(12) United States Patent
Kouzuki et al.

(10) Patent No.: US 7,301,202 B2
(45) Date of Patent: Nov. 27, 2007

(54) SEMICONDUCTOR DEVICE AND METHOD OF MANUFACTURING THE SAME

(75) Inventors: Shigeo Kouzuki, Kawasaki (JP); Hideki Okumura, Hyogo (JP); Wataru Saito, Kawasaki (JP); Masaru Izumisawa, Kawasaki (JP); Masahiko Shiomi, Yokohama (JP); Hitoshi Kobayashi, Yokohama (JP); Kenichi Tokano, Kawasaki (JP); Satoshi Yanagisawa, Kawasaki (JP); Hironori Yoshioka, Yokohama (JP); Manabu Kimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/151,410

(22) Filed: Jun. 14, 2005

(65) Prior Publication Data
US 2006/0138536 A1    Jun. 29, 2006

(30) Foreign Application Priority Data
Dec. 28, 2004    (JP)    ............................. 2004-379009

(51) Int. Cl.
*H01L 29/76*    (2006.01)

(52) U.S. Cl. ...................... 257/335; 257/336; 257/337; 257/339; 257/401; 257/341

(58) Field of Classification Search ................. 357/335; 257/336, 337, 339, 401, 341, 350, 390, E51.005, 257/E27.099, E27.148
See application file for complete search history.

(56) References Cited

U.S. PATENT DOCUMENTS

| | | | |
|---|---|---|---|
| 6,693,338 B2 | 2/2004 | Saitoh et al. | |
| 6,740,931 B2 | 5/2004 | Kouzuki et al. | |
| 2002/0175368 A1* | 11/2002 | Izumisawa et al. | 257/341 |
| 2003/0132450 A1* | 7/2003 | Minato et al. | 257/110 |
| 2004/0056306 A1 | 3/2004 | Saito et al. | |
| 2004/0065921 A1* | 4/2004 | Iwamoto et al. | 257/341 |
| 2004/0124465 A1* | 7/2004 | Onishi et al. | 257/341 |
| 2004/0140521 A1* | 7/2004 | Okumura et al. | 257/510 |
| 2004/0206989 A1 | 10/2004 | Aida et al. | |
| 2004/0238844 A1* | 12/2004 | Tokano et al. | 257/197 |
| 2005/0006699 A1* | 1/2005 | Sato et al. | 257/327 |
| 2005/0280079 A1* | 12/2005 | Jones | 257/330 |
| 2005/0280086 A1* | 12/2005 | Saito et al. | 257/341 |
| 2006/0043480 A1* | 3/2006 | Tsuchitani et al. | 257/341 |

FOREIGN PATENT DOCUMENTS

| | | |
|---|---|---|
| JP | 2001-102577 | 4/2001 |
| JP | 2002-170955 | 6/2002 |
| JP | 2003-309261 | 10/2003 |
| JP | 2004-119611 | 4/2004 |
| JP | 2004-319732 | 11/2004 |

OTHER PUBLICATIONS

G. Deboy, et al. "A New Generation of High Voltage MOSFETs Breaks The Limit Line Of Silicon", IEDM 98, pp. 683-685, 1998.

* cited by examiner

*Primary Examiner*—Thao P. Le
(74) *Attorney, Agent, or Firm*—Oblon, Spivak, McClelland, Maier & Neustadt, P.C.

(57) ABSTRACT

A semiconductor substrate of a first conduction type is provided for serving as a common drain to a plurality of power MISFET cells. A middle semiconductor layer is formed on the semiconductor substrate and has a lower impurity concentration than that of the semiconductor substrate. Pillar regions are formed on the middle semiconductor layer and include semiconductor regions of the first conduction type having a lower impurity concentration than that of the middle semiconductor layer.

19 Claims, 14 Drawing Sheets

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2004-379009, filed on Dec. 28, 2004, the entire content of which is incorporated herein by reference.

BACKGROUND OF THE INVENTION

1. Field of the Invention

The present invention relates to a semiconductor device including a plurality of vertical power MISFET cells and method of manufacturing the same.

2. Description of the Related Art

Development of a semiconductor device has been proceeded to achieve both a higher breakdown voltage and a lower on-resistance in a power MOSFET at the same time.

For example, a semiconductor device called Super Junction structure has been proposed by Deboy, G., et al. in "A New Generation of High Voltage MOSFETs Breaks the Limit of Silicon", IEDM Tech. Dig. (1998), P683-686. The device with such the structure causes a problem, however, because a large number of process steps are required for production and fine patterning of the size is difficult in the lateral direction or along the channel length.

In consideration of such the situation, the Applicant has proposed a semiconductor device including a power MOSFET and method of manufacturing the same, for example, in JP-A 2002-170955 (FIG. 7). The semiconductor device has a triple-layered pillar (such as NPN layers) formed to substantially serve the same role as the Super Junction structure to achieve both a lower on-resistance and a higher breakdown voltage at the same time. This semiconductor device can be produced, without invitation of a great increase in the number of process steps, in a smaller lateral size with a greatly lowered price.

The semiconductor device with the triple-layered pillar structure, however, causes a serge voltage when the power MOSFET transits the state from conductive to non-conductive. As a result, an avalanche current flows through drain-source. The maximum acceptable intensity of the avalanche current (avalanche withstand capability) is a very important subject matter in the power MOSFET. When the power MOSFET is kept non-conductive, a depletion layer is formed into a strip at a p-n junction between an n-type pillar layer and a p-type pillar layer, and a high electric field is placed across the depletion layer. If a serge voltage arises in such the condition, it causes local current crowding at the depletion layer. When the extent of the current crowding exceeds an acceptable value (avalanche withstand capability), it leads to device destruction at a high possibility.

SUMMARY OF THE INVENTION

In one aspect the present invention provides a semiconductor device. The semiconductor device comprises a semiconductor substrate of a first conduction type serving as a common drain to a plurality of power MISFET cells; a middle semiconductor layer of the first conduction type formed on the semiconductor substrate and having a lower impurity concentration than that of the semiconductor substrate; a plurality of pillar regions formed into strips in section on the middle semiconductor layer, including semiconductor regions of the first conduction type each having a lower impurity concentration than that of the middle semiconductor layer, and semiconductor regions of a second conduction type each having both sides sandwiched between the semiconductor regions of the first conduction type; a source diffusion layer of the first conduction type formed above the semiconductor region of the second conduction type of the plurality of pillar regions; a gate insulator film formed over a region sandwiched between the source diffusion layer and the semiconductor region of the first conduction type of the pillar regions; a gate electrode formed on the gate insulator film; and an isolation film formed between the plurality of pillar regions to isolate the pillar regions from each other.

In another aspect the present invention provides a semiconductor device. The semiconductor device comprises a semiconductor substrate of a first conduction type serving as a common drain to a plurality of power MISFET cells; a plurality of pillar regions formed into strips in section on the semiconductor substrate, including semiconductor regions of the first conduction type each having a lower impurity concentration than that of the semiconductor substrate, and semiconductor regions of a second conduction type each having both sides sandwiched between the semiconductor regions of the first conduction type; a source diffusion layer of the first conduction type formed above the semiconductor region of the second conduction type of the plurality of pillar regions; a gate insulator film formed over a region sandwiched between the source diffusion layer and the semiconductor region of the first conduction type of the pillar regions; a gate electrode formed on the gate insulator film; and an isolation film formed between the plurality of pillar regions to isolate the pillar regions from each other. The semiconductor region of the first conduction type of the pillar regions has a higher carrier concentration in the vertical direction at a lower portion close to the semiconductor substrate of the first conduction type, and the pillar region of the second conduction type has a higher carrier concentration at an upper portion opposite to the semiconductor substrate.

In one aspect the present invention provides a method of manufacturing a semiconductor device. The method comprises the steps of forming a semiconductor layer of a first conduction type having impurity concentrations gradually decreasing in proportion as approaching from the bottom to the top; forming trenches at a certain interval in the semiconductor layer; applying ion implantation to implant an impurity of the first conduction type and an impurity of a second conduction type having a larger diffusion coefficient than that of the impurity of the first conduction type into sides of the trenches, thereby changing the semiconductor layer sandwiched between the trenches into a pillar layer of the second conduction type extending in the vertical direction through the central portion and a pillar layer of the first conduction type extending in the vertical direction and having regions sandwiching the pillar layer of the second conduction type therebetween; forming a device isolation film in the trenches; forming a source diffusion layer of the first conduction type above the pillar layer of the second conduction type; forming a gate insulator film over a region sandwiched between the source diffusion layer and the pillar layer of the second conduction type; and forming a gate electrode on the gate insulator film.

DETAILED DESCRIPTION OF THE INVENTION

Embodiments of the present invention will now be described in detail with reference to the drawings.

Figure 1:
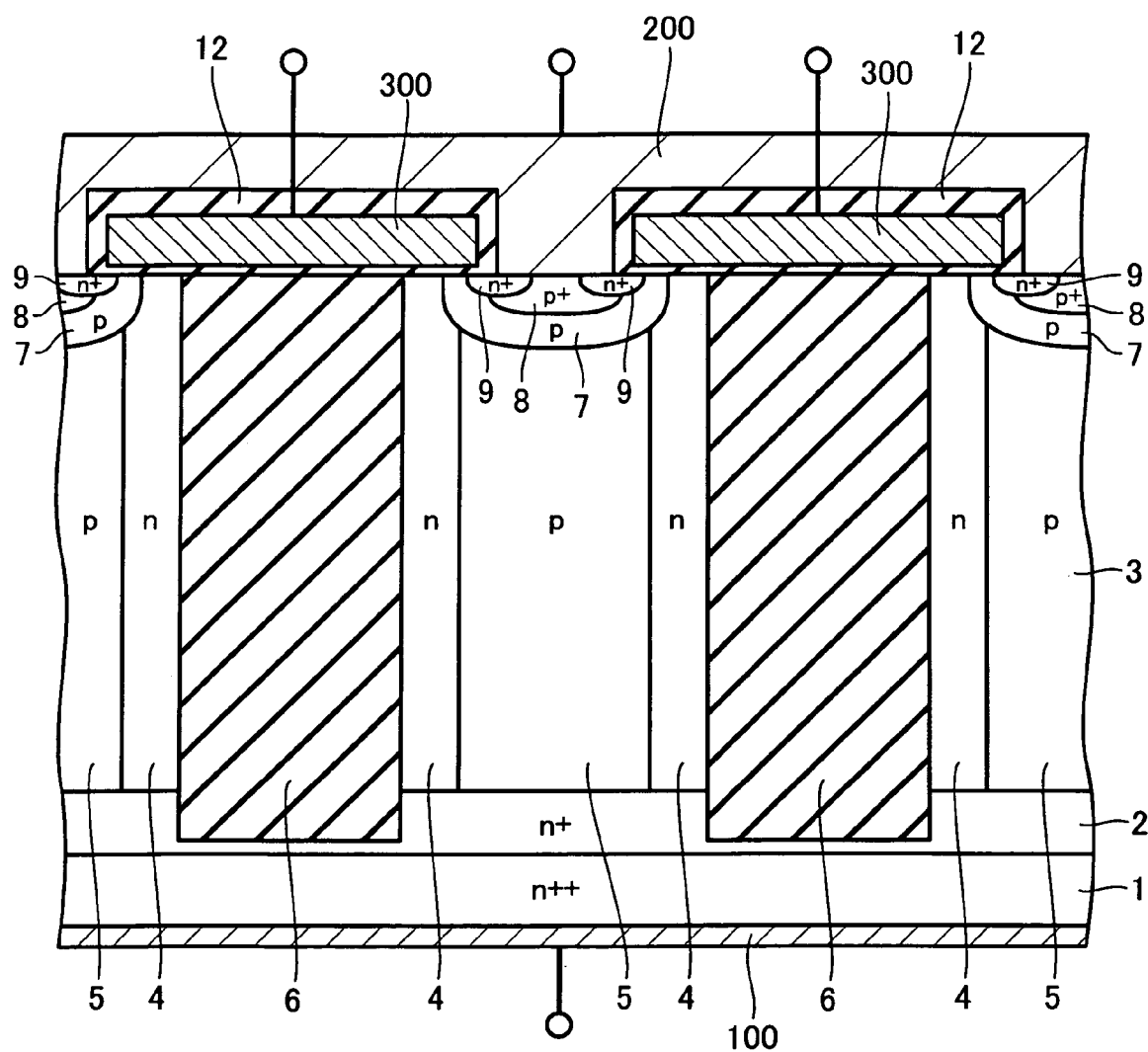
FIG. 1 shows part of a sectional structure of a deep trench MOSFET (DTMOSFET) according to a first embodiment of the present invention.

FIG. 1 shows part of a sectional structure of a deep trench MOSFET (DTMOSFET) according to a first embodiment of the present invention.

The DTMOSFET comprises an $n^{++}$-type semiconductor substrate 1, which serves as a common drain of MOSFETs that are isolated from each other with a device isolation film 6. The semiconductor substrate 1 is connected to a drain electrode 100. An $n^+$-type middle layer 2 is formed over the semiconductor substrate 1. A pillar layer 3 is formed on the middle layer 2 between portions of the device isolation film 6. The pillar layer 3 includes an n-type pillar layer 4 and a p-type pillar layer 5, which are formed into strips in the vertical direction and arranged alternately.

The middle layer 2 has an impurity concentration lower than that of the semiconductor substrate 1 and higher than that of the n-type pillar layer 4 by 2.5-30 times. For example, the impurity concentration in the middle layer 2 is determined approximately from 5.0E15 to 6.0E16 (cm sub −3) when the semiconductor substrate 1 has an impurity concentration of 5.0E18 (cm sub −3) and the n-type pillar layer 4 has an impurity concentration of 2.0E15 (cm sub −3). Preferably, it is determined approximately at 1.0E16 (cm sub −3).

A $p^+$-type base layer 8 having a high impurity concentration is formed above the upper surface of the p-type pillar layer 5 with a p-type layer 7 interposed therebetween. An $n^+$-type source diffusion layer 9 having a high impurity concentration is formed selectively on the upper surface of the base layer 8. The source diffusion layer 9 is connected to a source electrode 200. A gate insulator film 12 is formed over the $p^+$-type base layer 8 sandwiched between the $n^+$-type source diffusion layer 9 and the n-type pillar layer 4. A gate electrode 300 is formed on the gate insulator film 12. The gate insulator film 12 electrically insulates the source electrode 200 and the gate electrode 300 from each other.

Figure 2:
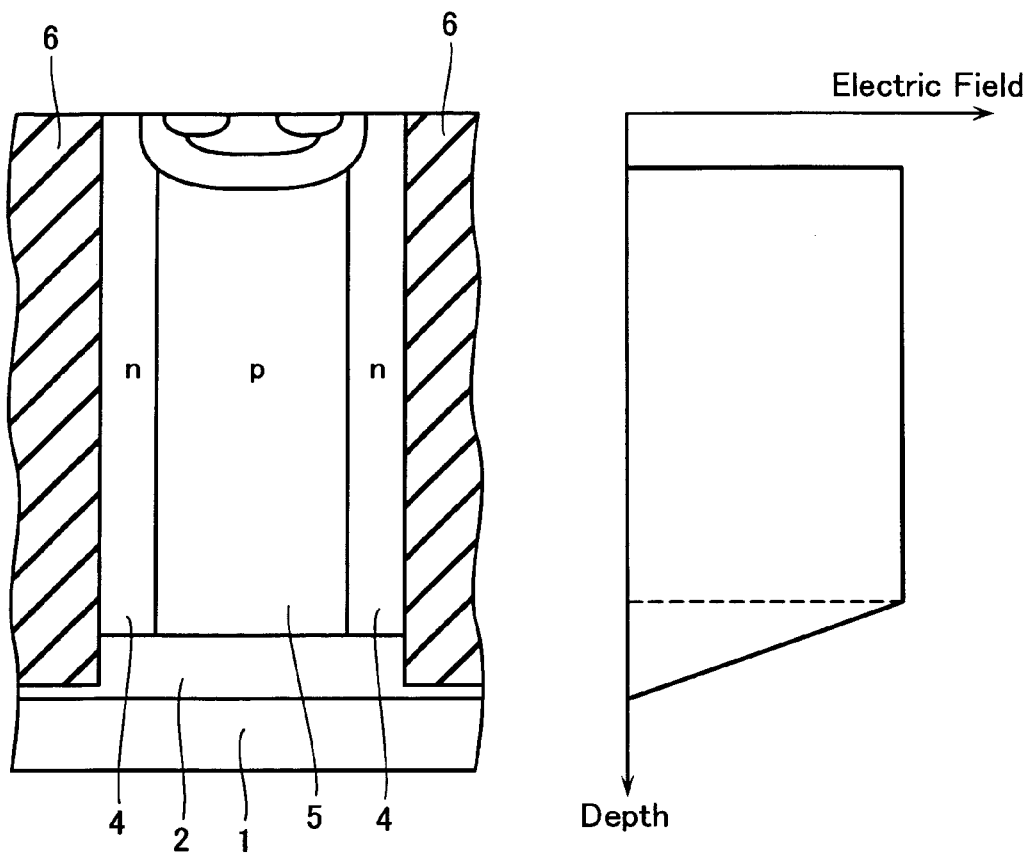
FIG. 2 shows an electric field distribution in the depth when the DTMOSFET of FIG. 1 is kept non-conductive.

The DTMOSFET of this embodiment comprises the middle layer 2 having the above impurity concentration as one of characteristics. A depletion layer based on a p-n junction is formed between the n-type pillar layer 4 and the p-type pillar layer 5 when each MOSFET is made non-conductive. A certain electric field is placed across the depletion layer. To the contrary, the electric field distribution in the middle layer 2 gradually decreases as approaching to the semiconductor substrate 1 because the impurity concentration is higher than that of the depletion layer (see FIG. 2). Accordingly, a large current based on avalanche breakdown flows in the middle layer 2. Thus, even if the electric field shown in FIG. 2 increases, the middle layer 2 has a margin corresponding to the extent of the decreased electric field. As a result, the extent of local current crowding is decreased and the possibility of device destruction is reduced extremely.

Figure 3:
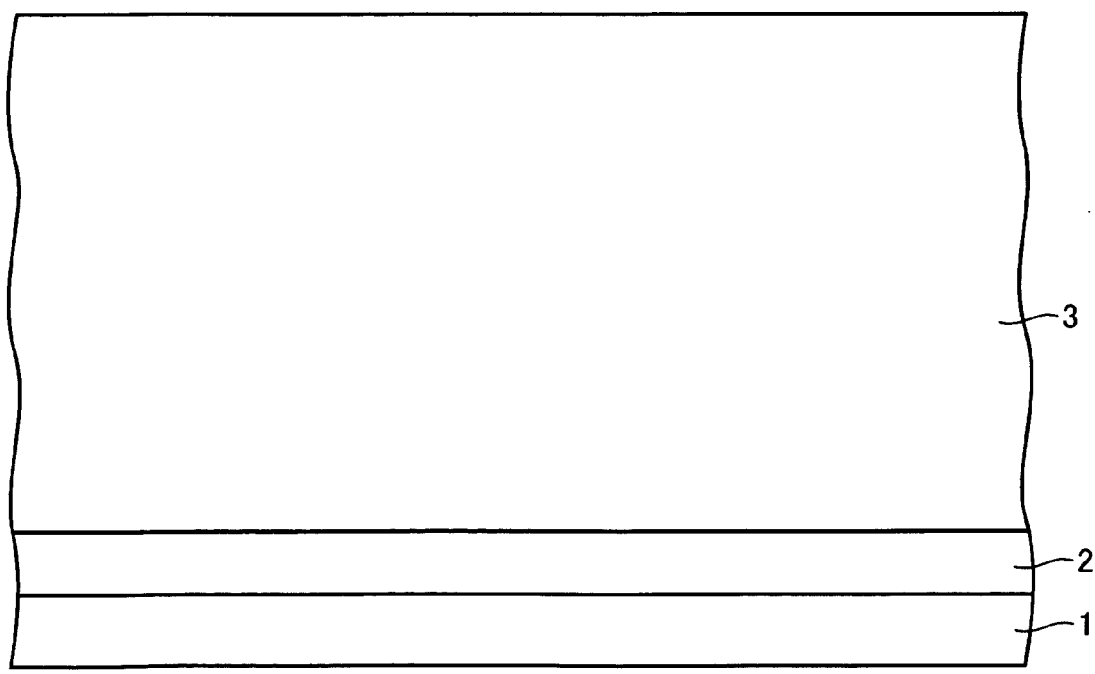
FIG. 3 shows a process step of manufacturing the DTMOSFET according to the first embodiment.

A method of manufacturing the DTMOSFET according to the first embodiment is described next with reference to FIGS. 3-7. First, as shown in FIG. 3, on the $n^{++}$-type semiconductor substrate 1, the $n^+$-type middle layer 2 having a lower impurity concentration than that of the substrate is epitaxially grown with a thickness of about 1-30 micrometers. Then, on the middle layer 2, the n-type pillar layer 3 having a lower impurity concentration than that of the middle layer 2 is epitaxially grown with a thickness of about 50 micrometers. Preferably, the middle layer 2 has a thickness of about 2-60% the thickness of the pillar layer 3.

Figure 4:
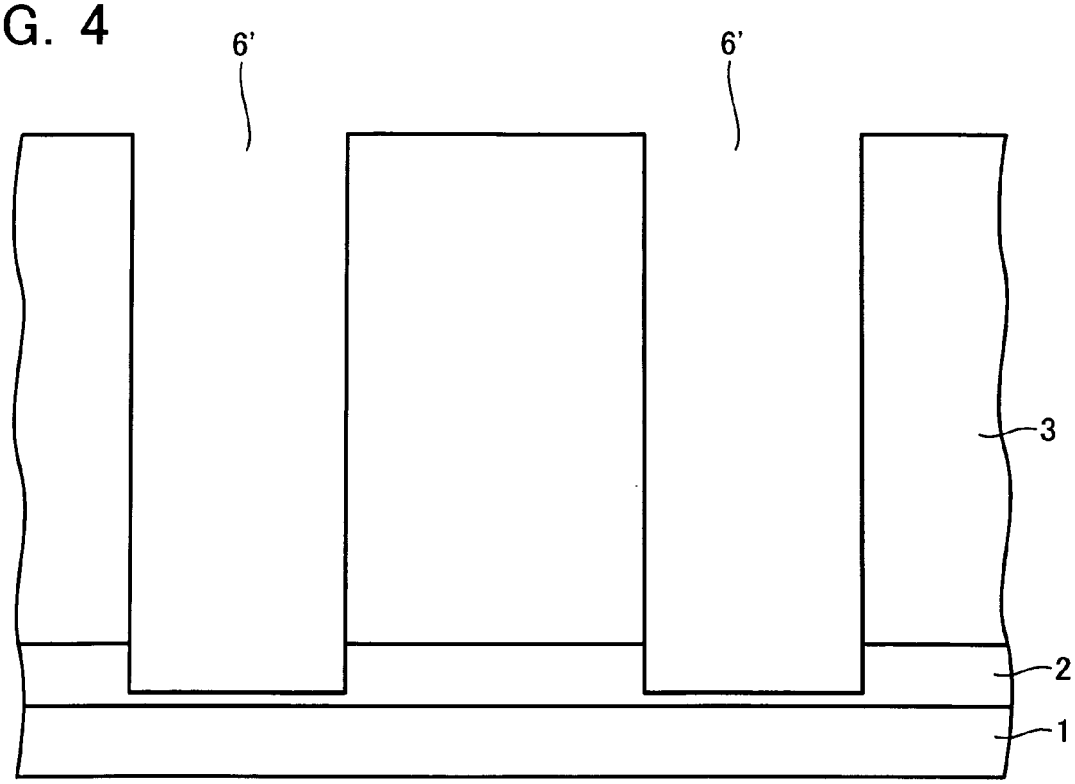
FIG. 4 shows a process step of manufacturing the DTMOSFET according to the first embodiment.

Next, as shown in FIG. 4, processes of photolithography and RIE (Reactive Ion Etching) are employed to form deep trenches 6' in the pillar layer 3 so as to reach the upper surface of the middle layer 2 at least. Accordingly, the trench has a depth of 51 micrometers or more and a width of, for example, 8 micrometers.

Figure 5:
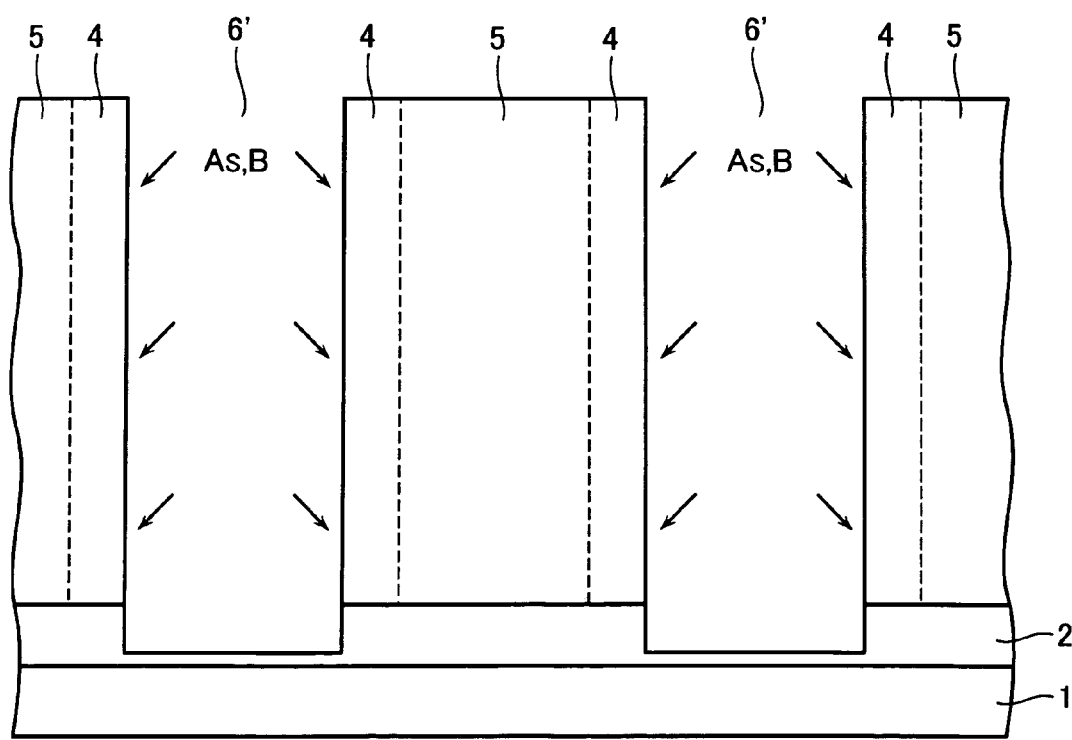
FIG. 5 shows a process step of manufacturing the DTMOSFET according to the first embodiment.

Next, as shown in FIG. 5, a process of rotational ion implantation is applied to implant arsenic (As) and boron (B) into sidewalls of the trenches 6' at an implantation angle of 5-7 degrees. A process of annealing is then performed at 1550 degrees Celsius for 24 hours to diffuse As and B at the same time from both sides of the mesa-structured pillar layer 3 sandwiched between the trenches 6'. In this case, As has a diffusion coefficient of about 9E-3 um sub 2/h at 1550 degrees Celsius while B has a diffusion coefficient of about 5.5E-2 um sub 2/h at 1550° C. Therefore, As diffuses about 2.5 micrometers while B diffuses about 7.5 micrometers because the diffusion coefficient of B is larger by one digit. As a result of the annealing, B diffused from the left side overlaps B diffused from the right side to form the strip-shaped p-type pillar layer 5 in the central portion of the mesa-structured pillar layer 3 sandwiched between the trenches 6' as shown in FIG. 5. In addition, the strip-shaped n-type pillar layer 4 is formed at the left and right sides outside the p-type pillar layer 5. The n-p-n structure composed of regions of the n-type pillar layer 4 and the p-type pillar layer 5 substantially serves the same role as that of the conventional Super Junction structure. Therefore, both a lower on-resistance and a higher breakdown voltage can be achieved at the same time.

Figure 6:
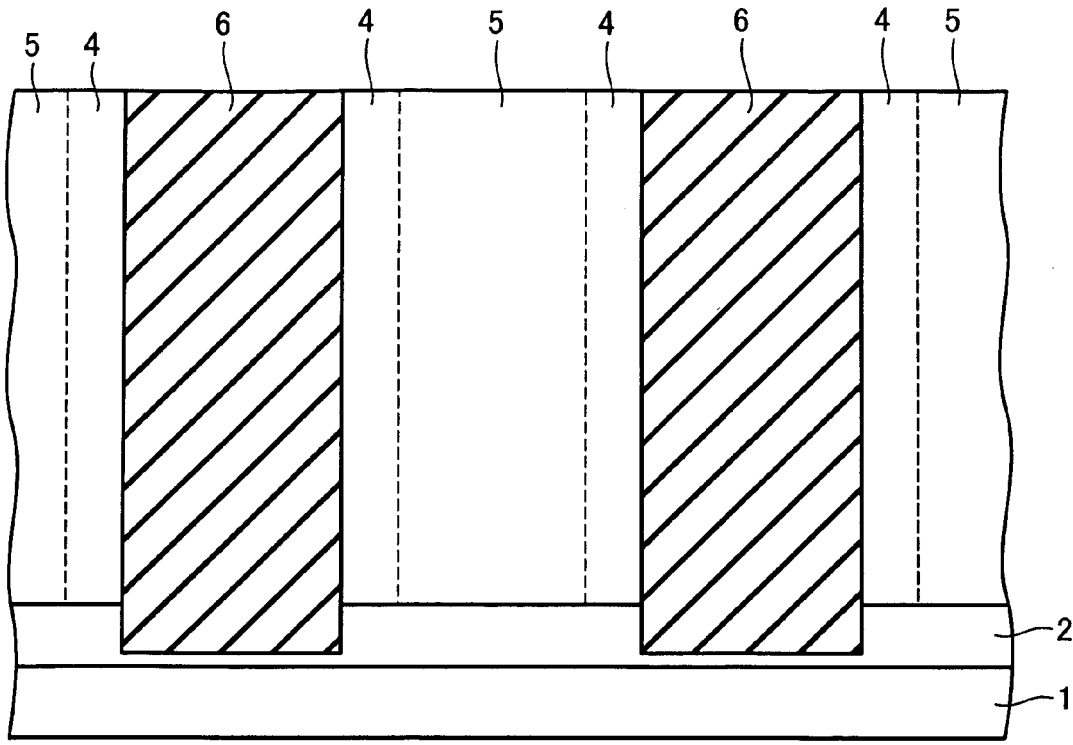
FIG. 6 shows a process step of manufacturing the DTMOSFET according to the first embodiment.

Next, as shown in FIG. 6, the device isolation film 6 composed of SiO2 is formed as buried in the trenches 6'. The device isolation film 6 may be formed by forming a SiO2 film on the sides of the trenches 6' by thermal oxidation; then depositing a SiO2 film over the entire surface by CVD (Chemical Vapor Deposition); and subsequently removing undesired portions of the insulator film outside the trenches 6' by CMP (Chemical Mechanical Polishing).

Figure 7:
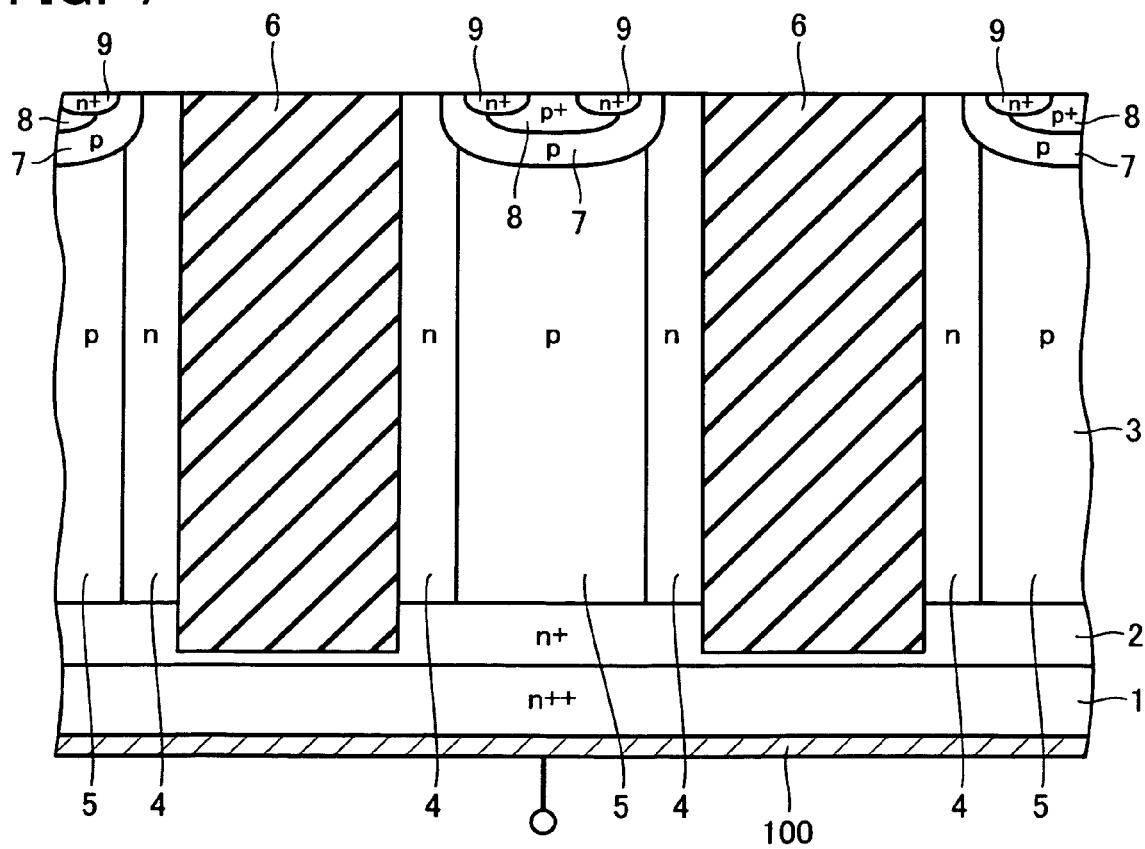
FIG. 7 shows a process step of manufacturing the DTMOSFET according to the first embodiment.

Then, as shown in FIG. 7, the step of forming the p-type layer 7 on the upper surface of the p-type pillar layer 5, the step of forming the p$^+$-type base layer 8 on the p-type layer 7, and the step of forming the n$^+$-type source diffusion layer 9 selectively on the upper surface of the p$^+$-type base layer 8 are executed to form a MOSFET in each region sandwiched between the portions of the device isolation film 6. Then, a known process of photolithography is employed to form the electrode 100 on the lower surface, and the electrodes 200 and 300, the gate insulator film 12 and so forth on the upper surface to complete the DTMOSFET as shown in FIG. 1.

Figure 8:
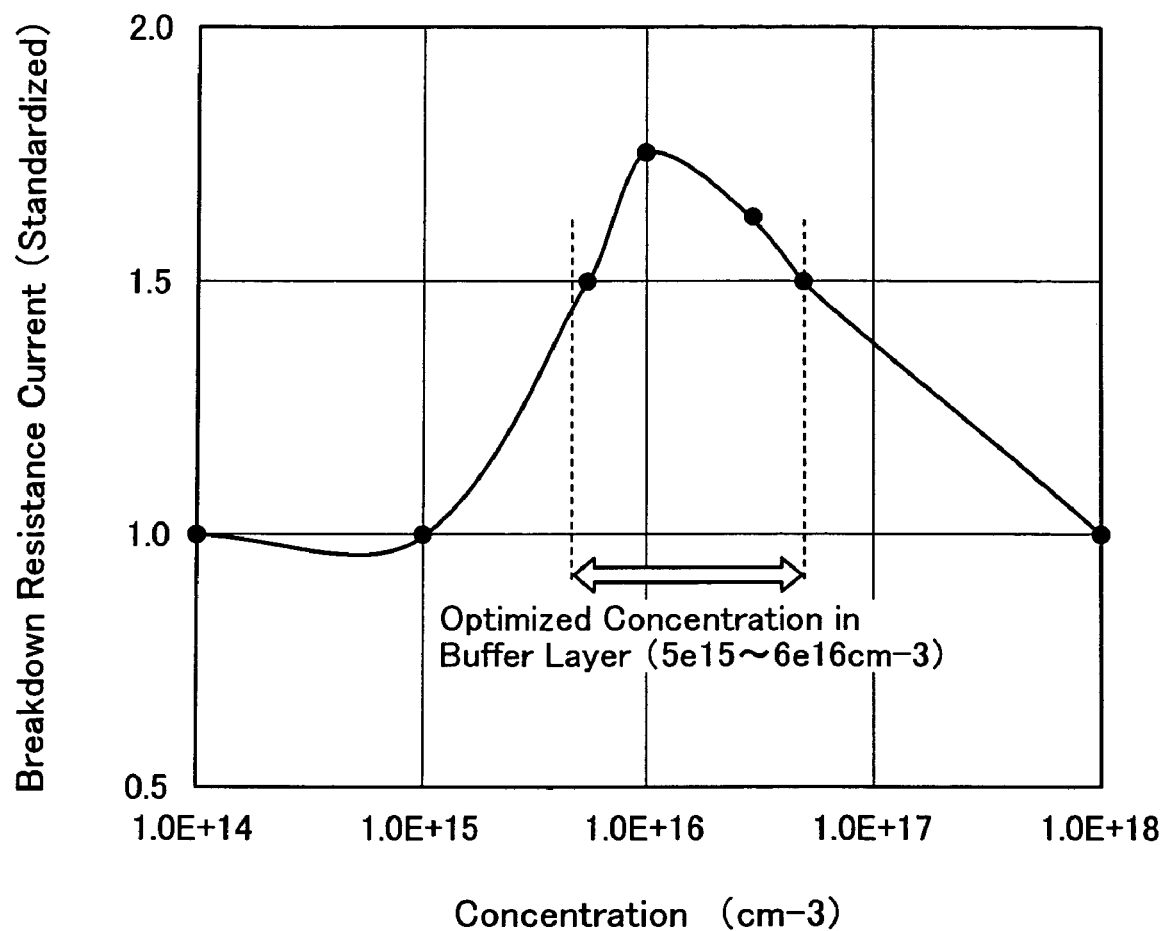
FIG. 8 is a graph showing breakdown resistance currents relative to impurity concentrations in a middle layer 2 in the DTMOSFET according to the first embodiment.

FIG. 8 graphs variations in breakdown resistance current while the impurity concentration in the middle layer 2 is changed from 1.0E14 (cm sub −3) through 1.0E18 (cm sub −3). In this case, the semiconductor substrate 1 has an impurity concentration of 5.0E18 (cm sub −3) and the n-type pillar layer 4 has an impurity concentration of 2.0E15 (cm sub −3). In FIG. 8, the representation of the breakdown resistance current is standardized with reference to 1 (one), which is given to the current in the case of the impurity concentration in the middle layer 2 of 1.0E14 (cm sub −3) or the impurity concentration substantially similar to the n-type pillar layer 4. The breakdown resistance current elevates up to 1.75 times the reference in the vicinity of the impurity concentration in the middle layer 2 of 1.0E16 (cm sub −3). A breakdown resistance current equal to 1.5 times the reference can be obtained when the impurity concentration in the middle layer 2 ranges from 5.0E15 to 6.0E16 (cm sub −3). A higher breakdown resistance can be achieved when the impurity concentration in the middle layer 2 is determined at a middle value between those in the n-type pillar layer 4 and the semiconductor substrate 1.

A DTMOSFET according to a second embodiment of the present invention is described with reference to FIG. 9. This embodiment omits the middle layer 2 provided in the first embodiment and instead changes the concentrations of the impurity along the depth (in the vertical direction). Namely, at a lower portion close to the semiconductor substrate 1, the n-type pillar layer 4 is designed to have a higher carrier concentration than that of the p-type pillar layer 5. To the contrary, at an upper portion opposite to the semiconductor substrate 1, the p-type pillar layer 5 is designed to have a higher carrier concentration than that of the n-type pillar layer 4.

Accordingly, the n-type pillar layer 4 has a higher carrier concentration at the lower portion close to the semiconductor substrate 1 than that at the upper portion. For example, the n-type pillar layer 4 has a carrier concentration of about 2.5E16 (cm sub −3) at the lower portion close to the semiconductor substrate 1. The n-type pillar layer 4 is designed to have carrier concentrations that gradually decrease in proportion as approaching to the upper portion and finally reach about 2.5E15 (cm sub −3) in the vicinity of the upper portion. To the contrary, the p-type pillar layer 5 is designed to have a higher carrier concentration at the upper portion and a lower concentration at the lower portion close to the semiconductor substrate 1. The carrier concentrations of the p-type pillar layer 5 are determined in consideration of a balance between a desired breakdown voltage and an on-resistance. For maximization of the breakdown voltage of the DTMOSFET, the whole n-type pillar layer 4 is designed to have a carrier concentration equal to the carrier concentration in the whole p-type pillar layer 5. In other words, the carrier concentrations are controlled not to cause any charge unbalance. It is also possible to allow some charge unbalance and control the impurity concentrations, such that the n-type pillar layer 4 has a higher carrier concentration than that in the p-type pillar layer 5, to lower the on-resistance of the n-type pillar layer 4. If the n-type pillar layer 4 has the above-described distribution of carrier concentrations and the maximization of the breakdown voltage is intended, the p-type pillar layer 5 is designed to have a carrier concentration of about 2.0E15 (cm sub −3) at the lower portion close to the semiconductor substrate 1. The p-type pillar layer 5 is designed to have carrier concentrations that gradually increase in proportion as approaching to the upper portion and finally reach about 2.5E16 (cm sub −3) in the vicinity of the upper portion. The concentration gradient may be given along the depth to only one of the n-type pillar layer 4 and the p-type pillar layer 5.

A method of manufacturing the DTMOSFET according to the second embodiment is described next with reference to FIGS. 10-13. First, on the semiconductor substrate 1 having an impurity concentration, Ns (cm sub −3), the pillar layer 3 is epitaxially grown with a thickness of about 50 micrometers. In this case, the pillar layer is given impurity concentrations that are controlled to gradually decrease in proportion as approaching from the bottom to the top. As a result, the impurity concentrations gradually decrease from delta Nb (cm sub −3) at the bottom to delta Nt (cm sub −3) (5-20% smaller than delta Nb) in the vicinity of the top in proportion as approaching to the top (see FIG. 11).

Figure 12:
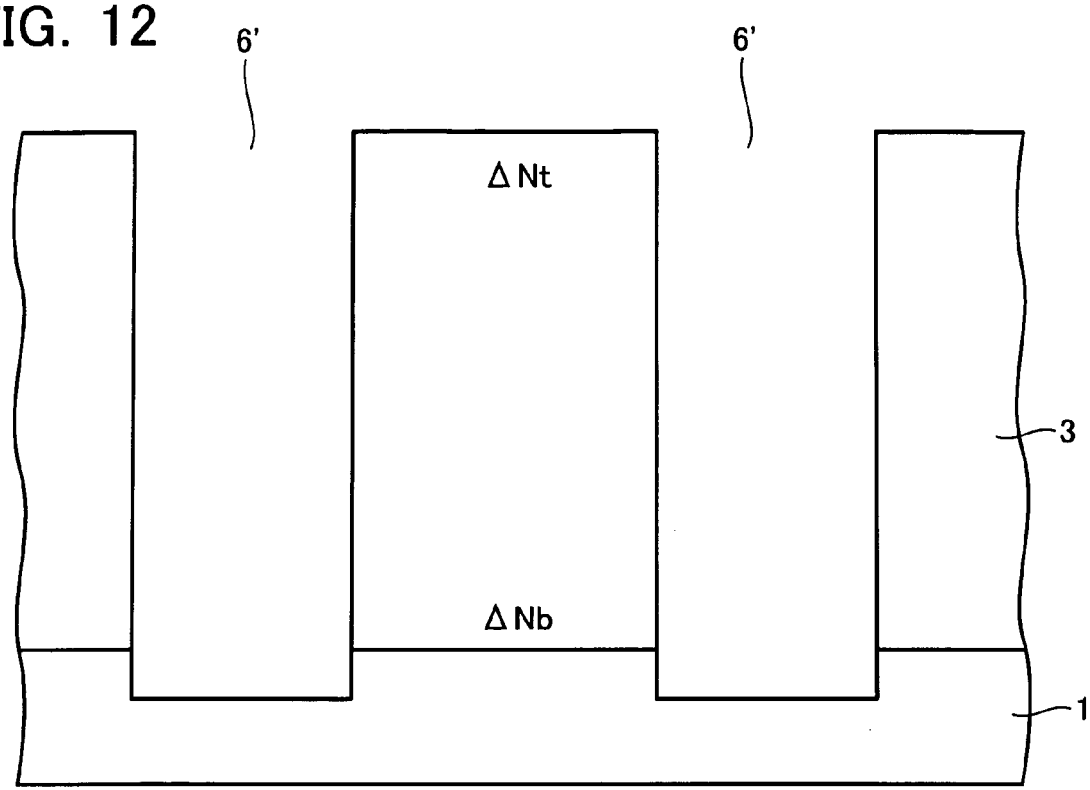
FIG. 12 shows a process step of manufacturing the DTMOSFET according to the second embodiment.
Figure 13:
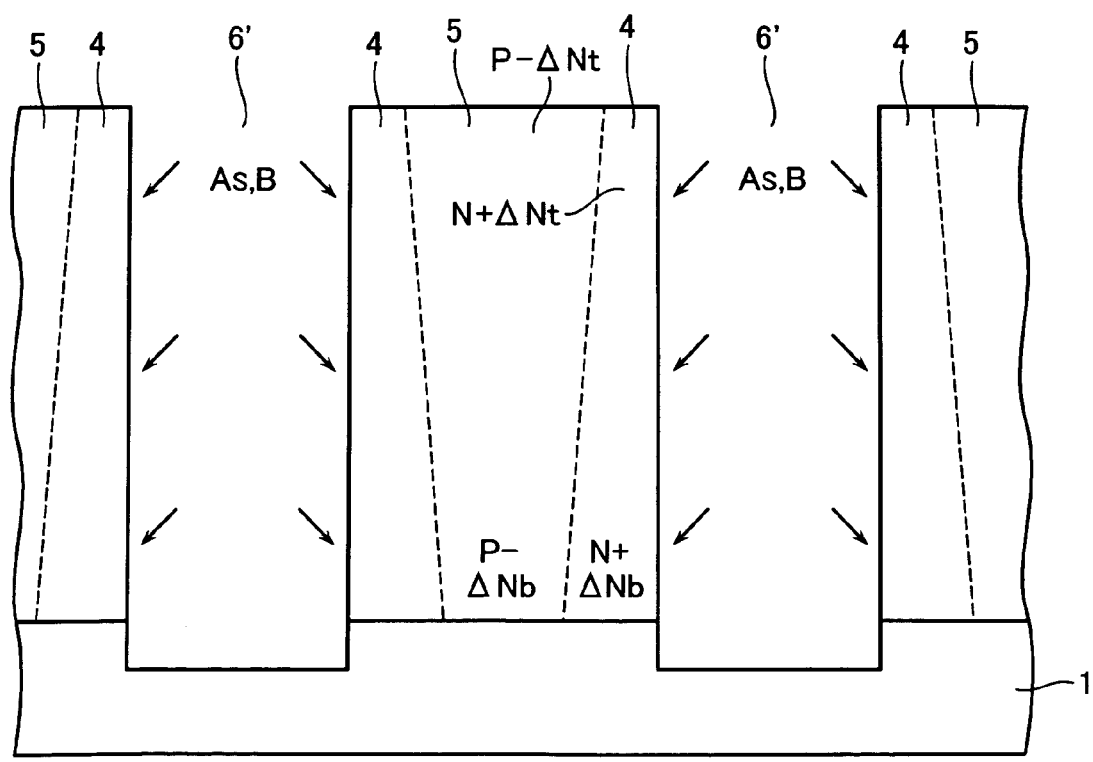
FIG. 13 shows a process step of manufacturing the DTMOSFET according to the second embodiment.

Then, like the first embodiment, the trenches 6' are formed down to a depth that reaches the upper surface of the semiconductor substrate 1 (FIG. 12). Subsequently, rotational ion implantation is applied to implant As and B into the trenches 6' followed by annealing, as shown in FIG. 13, to form the n-type pillar layer 4 and the p-type pillar layer 5 having the above-described gradient on the carrier concentration along the depth. As described above, the pillar layer 3 is designed during the production such that the carrier concentration has a gradient along the depth. Accordingly, even if the concentrations N and P of As and B implanted by rotational ion implantation are uniform in the depth, the n-type pillar layer 4 and the p-type pillar layer 5 having the above-described gradient on the carrier concentration can be formed. In a word, the n-type pillar layer 4 has a carrier concentration, N+delta Nb (cm sub −3), in the vicinity of the bottom and a carrier concentration, N+deltaNt, in the vicinity of the top (in a relation of N+deltaNb>N+deltaNt). On the other hand, the p-type pillar layer 5 has a carrier concentration, P−deltaNb (cm sub −3), in the vicinity of the bottom and a carrier concentration, P−deltaNt (cm sub −3), in the vicinity of the top (in a relation of P−deltaNb>P−deltaNt). Preferably, P and N may be determined to satisfy the following two equations.

$$1.05 < (P-\text{deltaNb})/(N+\text{deltaNb}) < 1.3 \quad (1)$$

$$0.7 < (P-\text{deltaNt})/(N+\text{deltaNt}) < 0.95 \quad (2)$$

Figure 9:
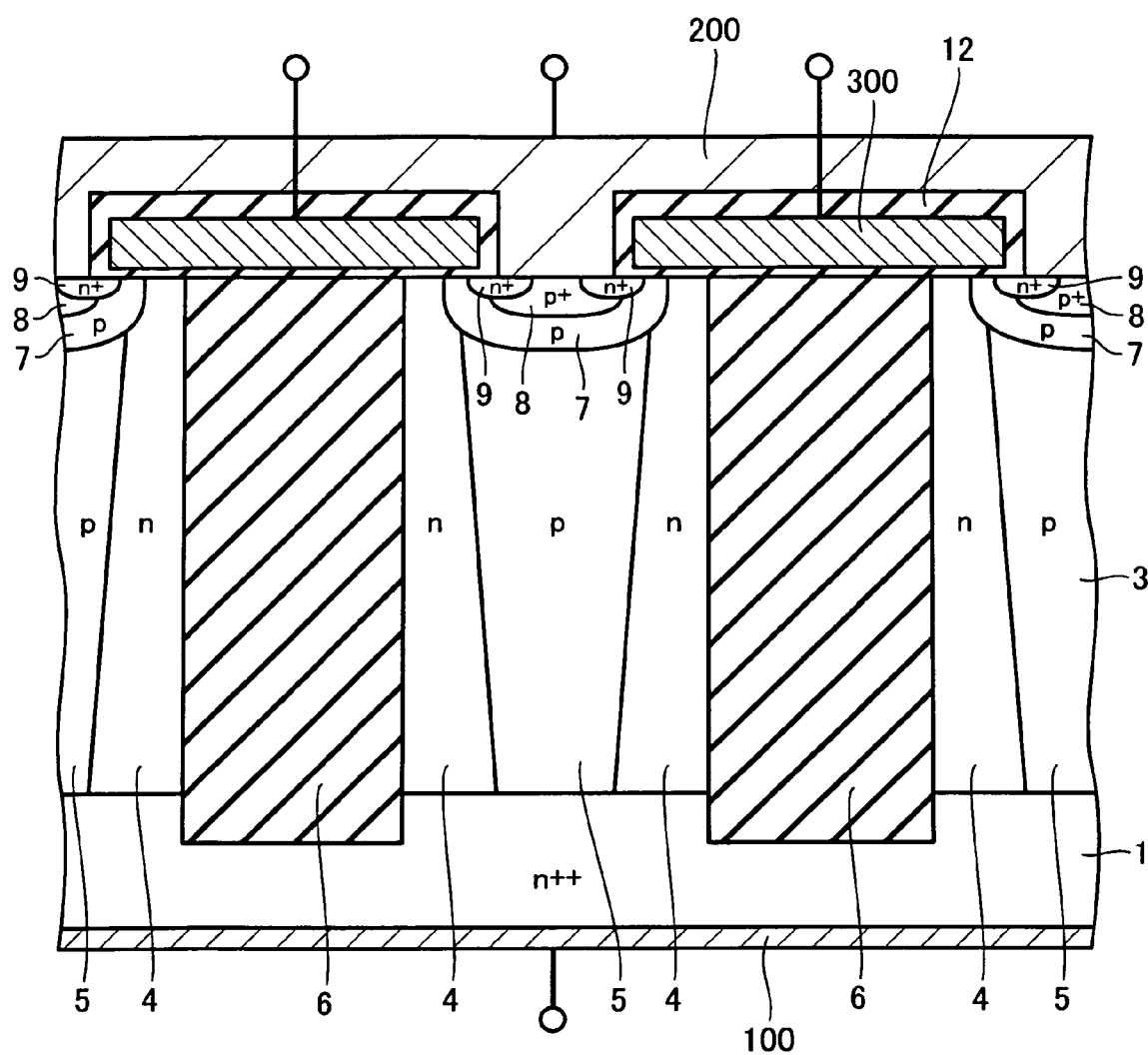
FIG. 9 shows part of a sectional structure of a DTMOSFET according to a second embodiment of the present invention.
Figure 10:
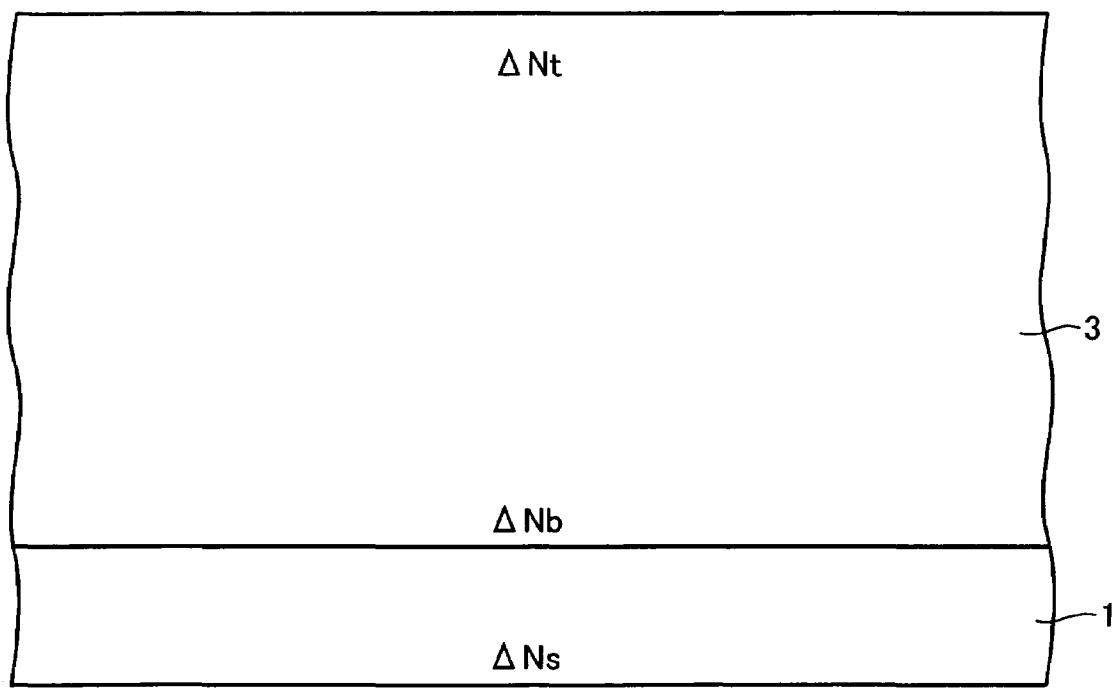
FIG. 10 shows a process step of manufacturing the DTMOSFET according to the second embodiment.
Figure 11:
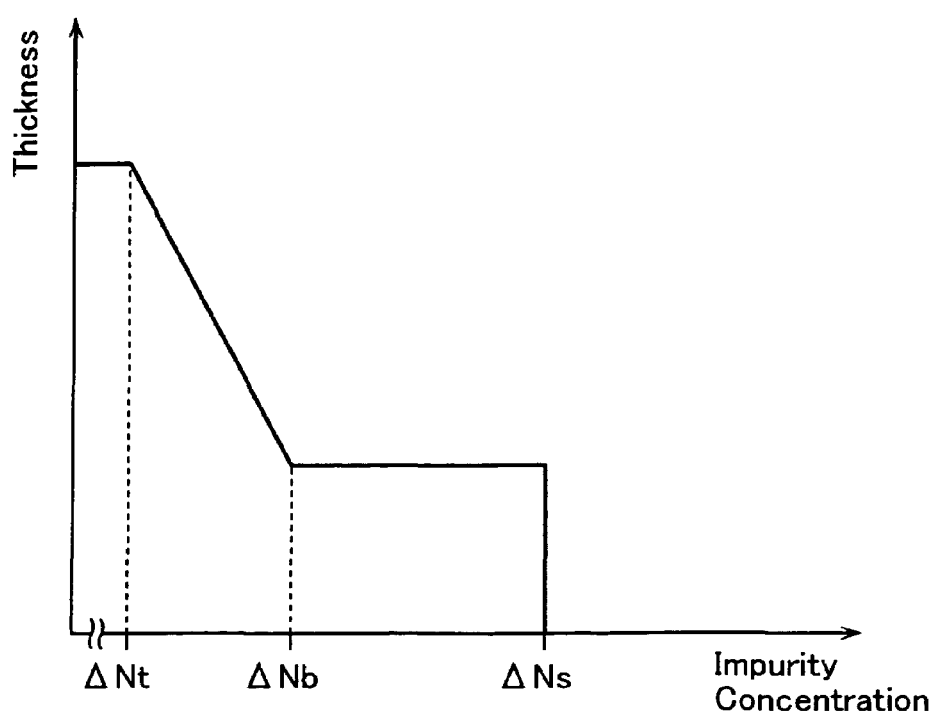
FIG. 11 shows an impurity concentration distribution in a pillar layer 3.
Figure 14:
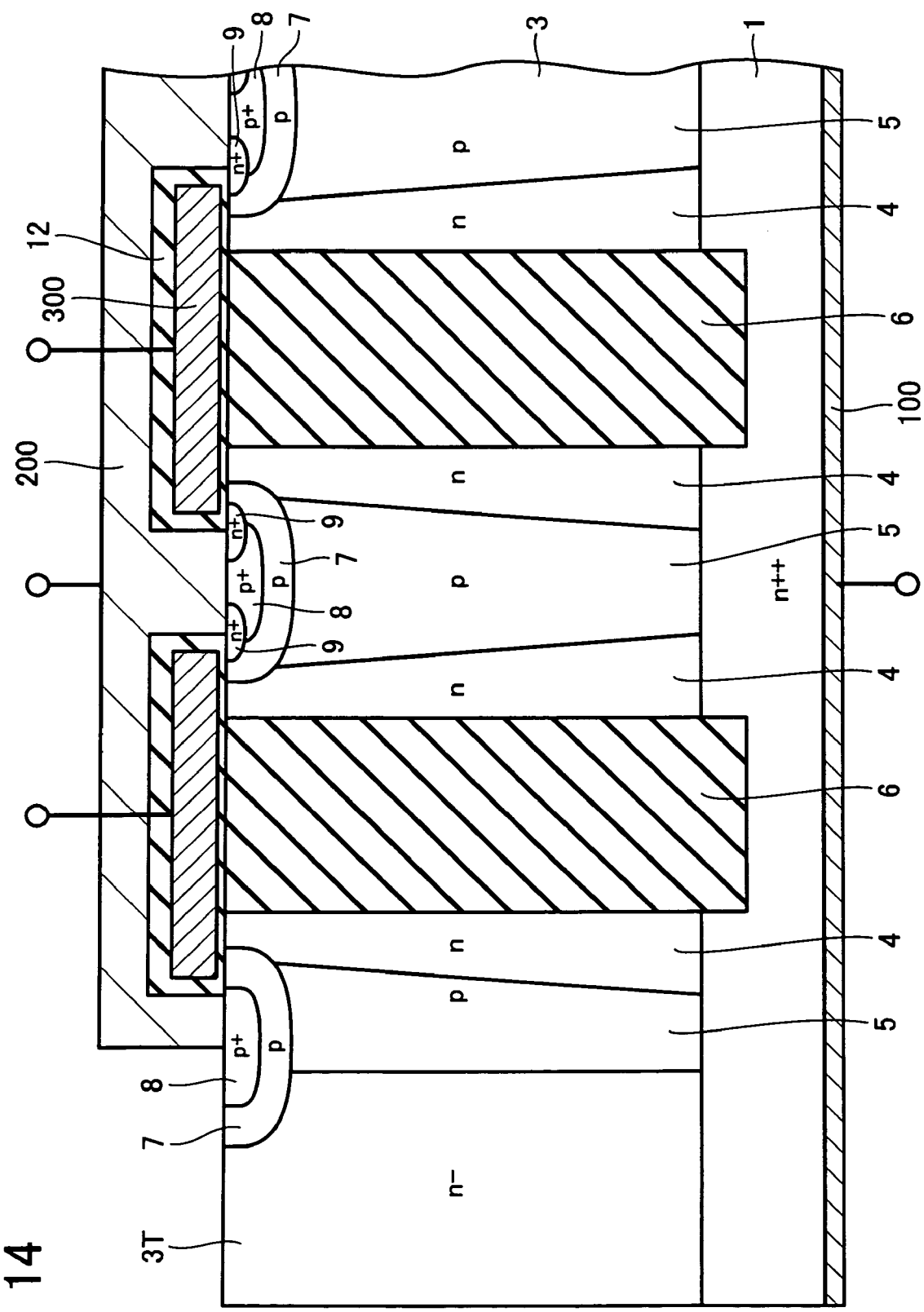
FIG. 14 shows a structure of a terminal portion 3T in the DTMOSFET according to the second embodiment.

Thereafter, the same steps as those described with reference to FIGS. 6 and 7 are executed to complete the DTMOSFET as shown in FIG. 9. This DTMOSFET includes a terminal portion 3T (FIG. 14). The terminal portion 3T suffers no ion implantation by the rotational ion implantation. Accordingly, the terminal portion 3T is designed to have such impurity concentrations that gradually increase from deltaNb at the bottom to deltaNt in the vicinity of the top, in proportion as approaching to the top, like the original pillar layer 3.

Figure 15:
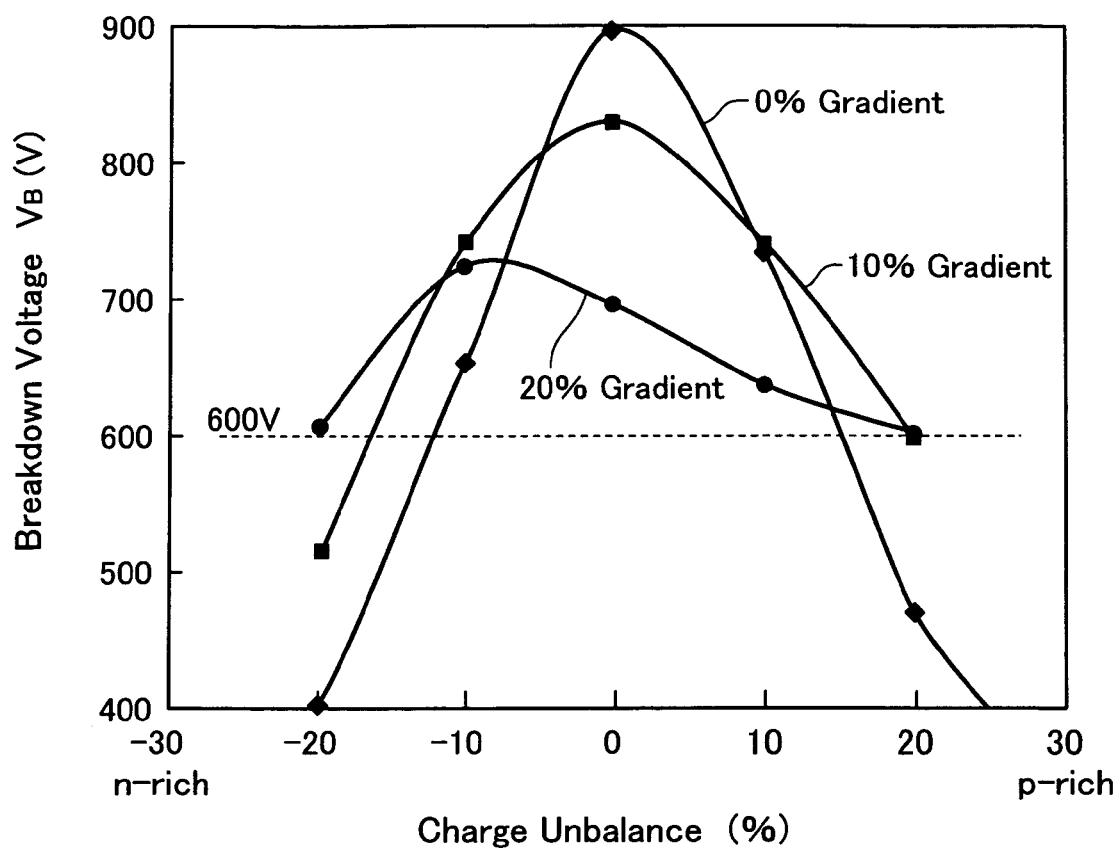
FIG. 15 is a graph showing variations in breakdown voltage of DTMOSFET when the gradient on a carrier concentration in the depth of an n-type pillar layer 4 is varied together with charge unbalance in the DTMOSFET according to the second embodiment.

FIG. 15 graphs variations in breakdown voltage of DTMOSFET while the degree of gradient on the carrier concentration along the depth in the n-type pillar layer 4 is changed among 0%, 10%, 20% and the charge unbalance is changed from −20% through 20%.

If the charge unbalance is 0%, that is, the maximum breakdown voltage can be attained, the larger the gradient increases, the lower the breakdown voltage lowers though it keeps a breakdown voltage of 600 V as requested in recent power MOSFETs. A larger gradient can increase the breakdown resistance current compared to no gradient. This is almost similar in the case where some charge unbalance is allowed because the on-resistance is lowered. Also in the case of an increased gradient, a breakdown voltage of 600 V or more can be kept.

During epitaxial growth of the pillar layer 3, keeping the impurity concentration constant in the vertical direction and changing the concentrations of implantation by rotational ion implantation in the vertical direction can form such the pillar layer as described above. A larger angle of ion implantation makes the pillar impurity concentration larger and the depth from the implanted substrate surface shallower. Repetition of the implantation plural times at varied angles can provide the p-type pillar layer 5 with a higher concentration at the upper portion and a lower concentration at the lower portion close to the semiconductor substrate 1. In this case, the p-type pillar layer 5 has a profile of impurity concentrations that change stepwise in accordance with variations in implantation angle.

Figure 16:
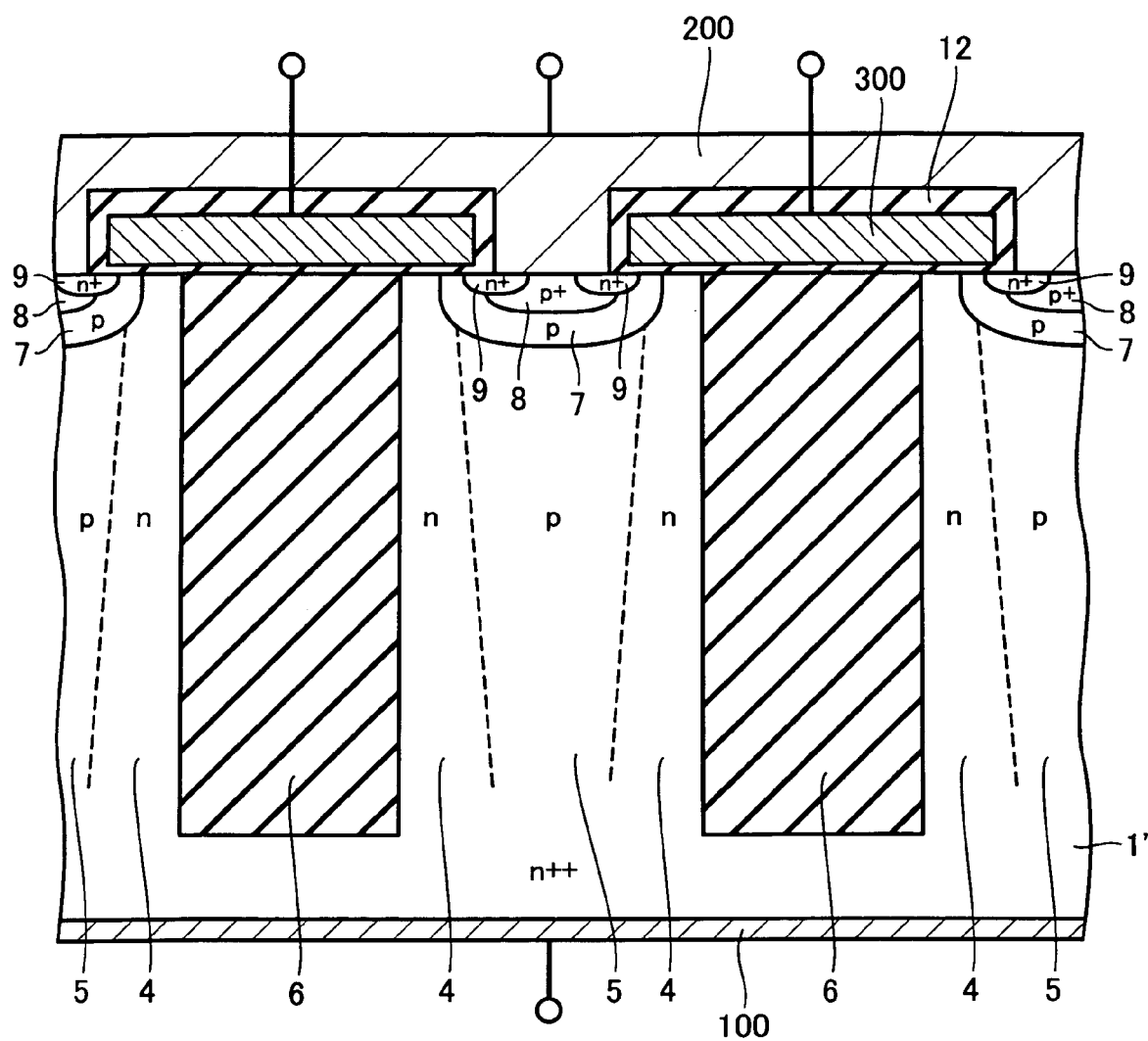
FIG. 16 shows part of a sectional structure of a DTMOSFET according to a third embodiment of the present invention.
Figure 17:
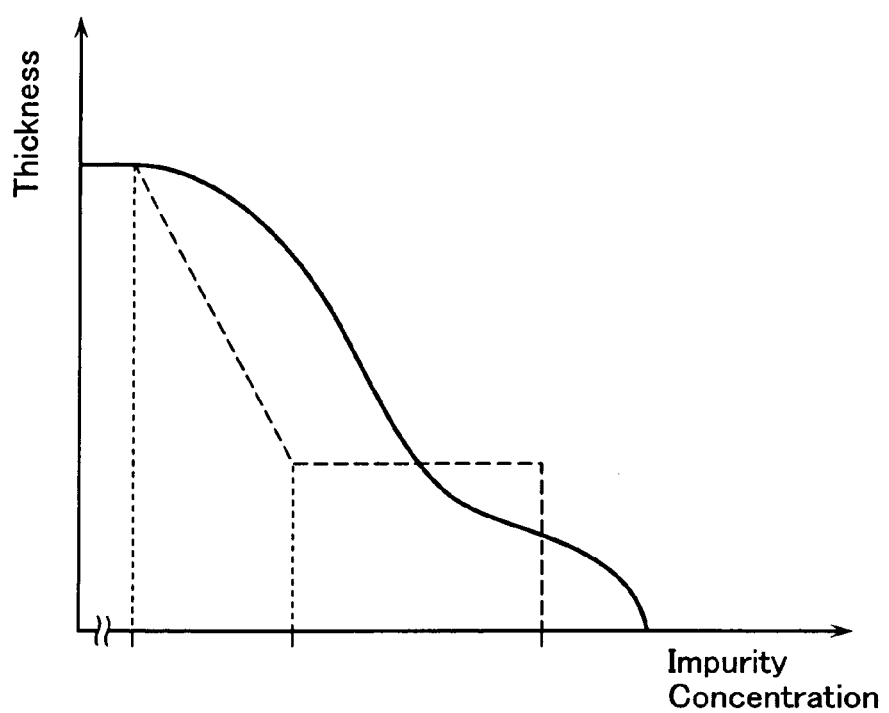
FIG. 17 shows an impurity concentration distribution in a diffused wafer 1' for use in the third embodiment as a semiconductor substrate.

A DTMOSFET according to a third embodiment is described next with reference to FIG. 16. Different from the preceding embodiment, this embodiment employs a wafer (diffused wafer) 1' as the semiconductor substrate for use in formation of the DTMOSFET. This wafer is given variations in impurity concentration along the depth, for example, as shown in FIG. 17 during the diffusion step.

Figure 18:
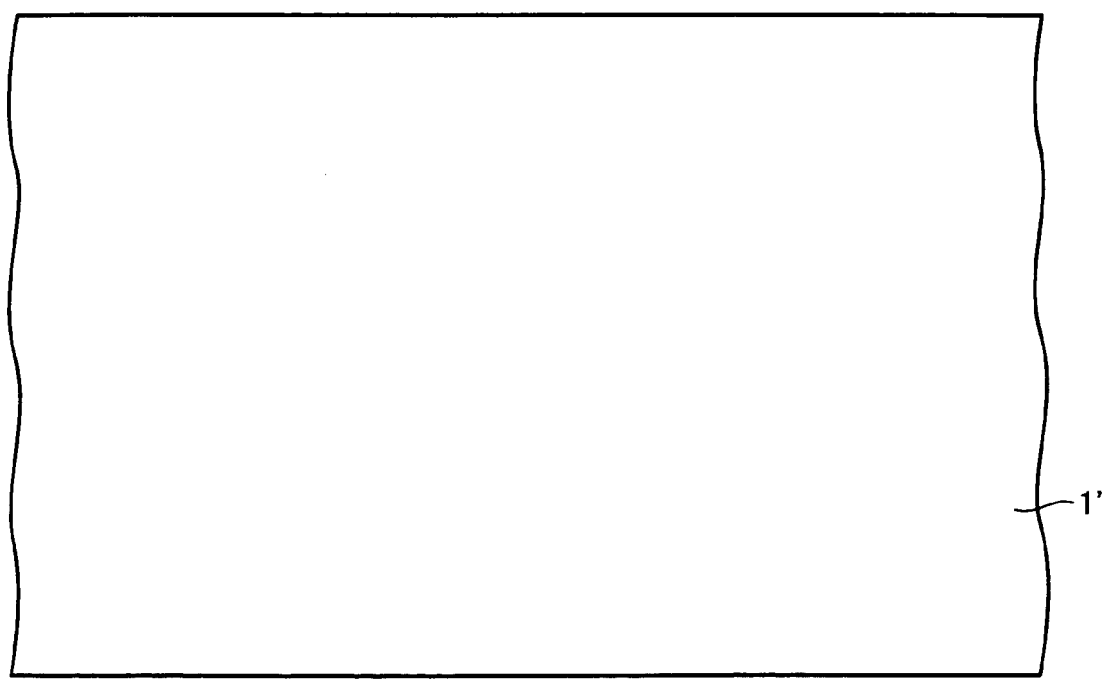
FIG. 18 shows a process step of manufacturing the DTMOSFET according to the third embodiment.
Figure 19:
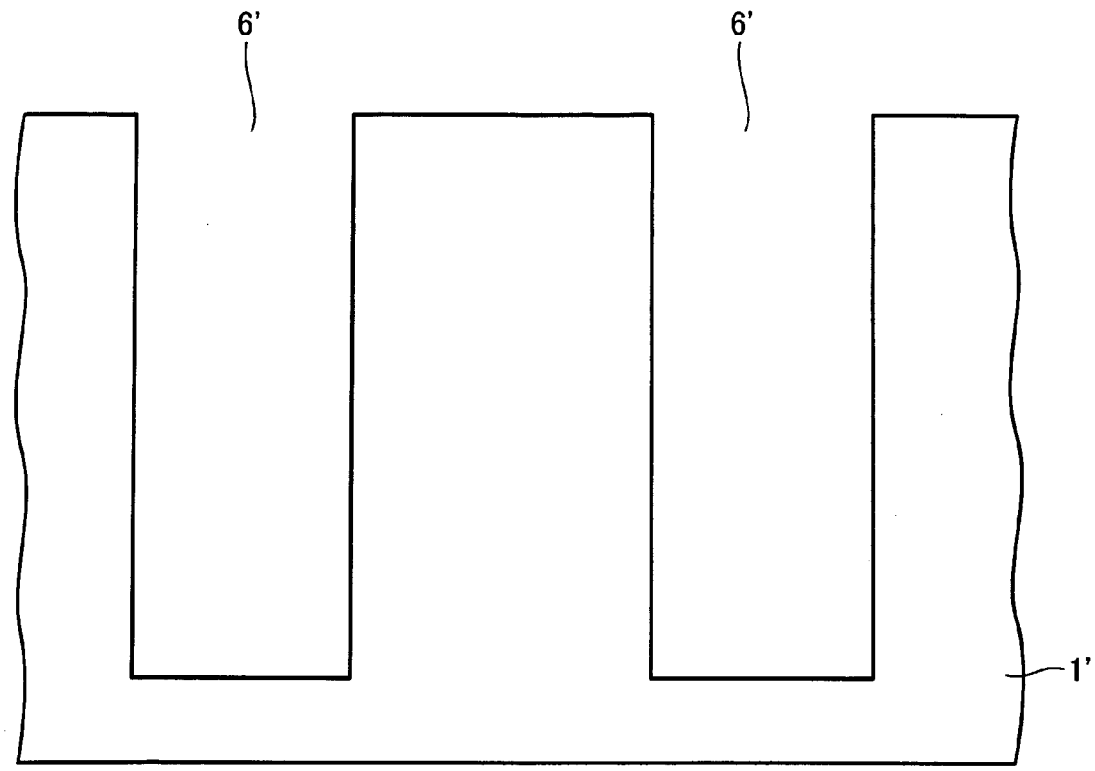
FIG. 19 shows a process step of manufacturing the DTMOSFET according to the third embodiment.
Figure 20:
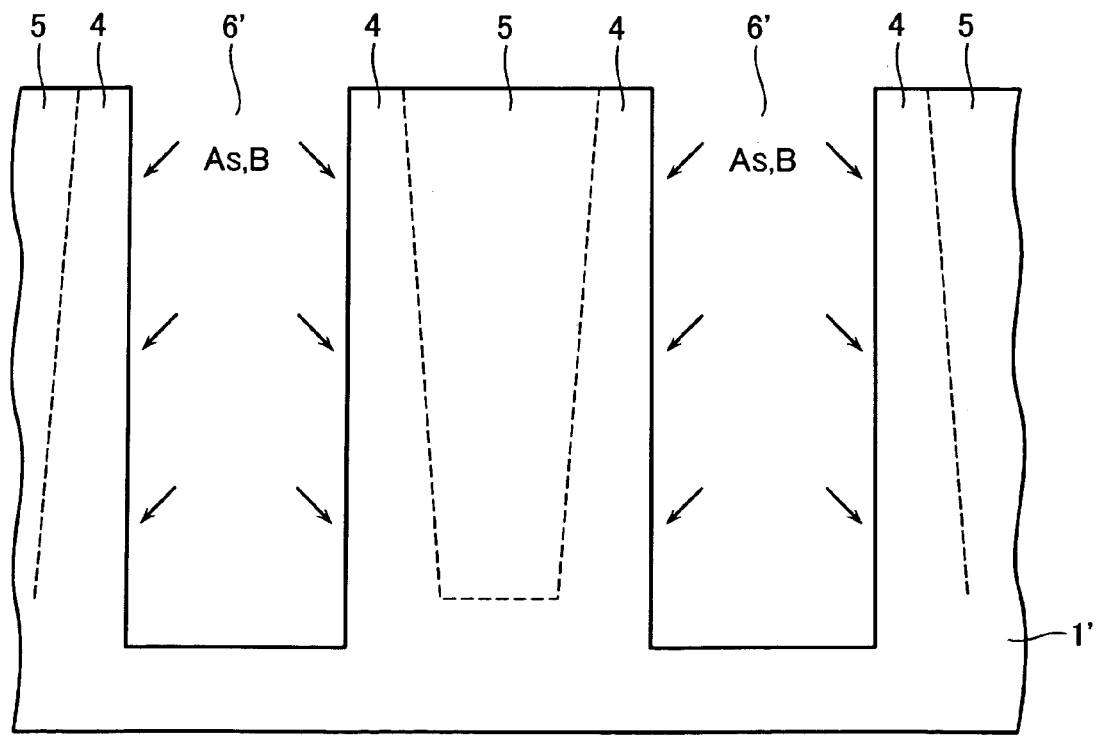
FIG. 20 shows a process step of manufacturing the DTMOSFET according to the third embodiment.

The process steps of manufacturing the DTMOSFET of this embodiment are described with reference to FIGS. 18-20. In the diffused wafer 1' (FIG. 18), the trenches 6' are formed like in the preceding embodiment (FIG. 19). Then, the same methods as those described with reference to FIG. 13 are employed to form the n-type pillar layer 4 and the p-type pillar layer 5 between the trenches 6'. The subsequent steps are similar to those in the preceding embodiment. This third embodiment is possible to eliminate the need for the epitaxial growth step of forming the pillar layer 3 and simplify the process steps.

Figure 21:
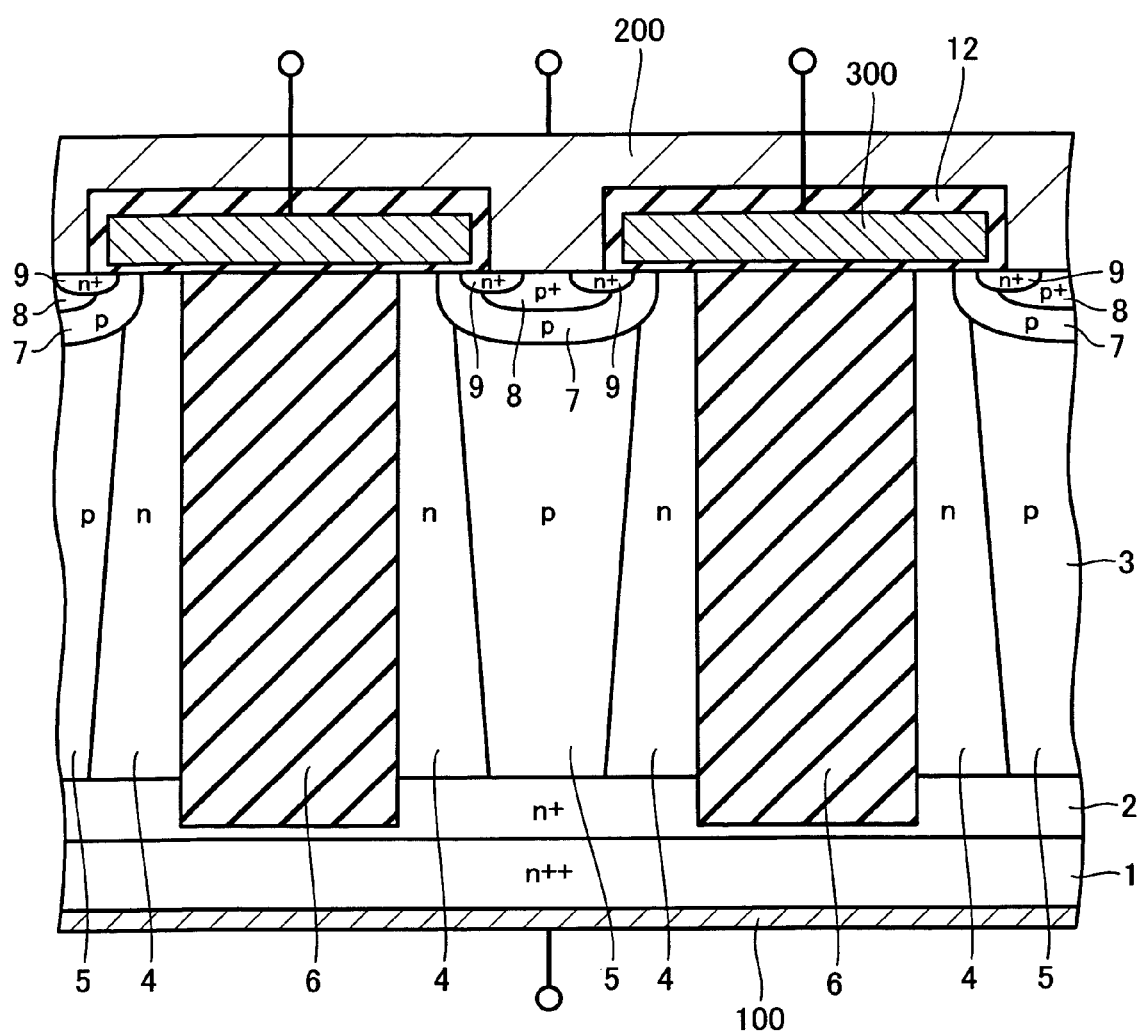
FIG. 21 shows part of a sectional structure of a DTMOSFET according to a fourth embodiment of the present invention.

A DTMOSFET according to a fourth embodiment is described next with reference to FIG. 21. The DTMOSFET according to this embodiment includes the middle layer 2 that is formed over the semiconductor substrate 1 like in the first embodiment. In addition, it has the structure that is given variations in carrier concentration along the depth in the n-type pillar layer 4 and the p-type pillar layer 5.

For example, the semiconductor substrate 1 has an impurity concentration of about 5.0E18 (cm sub −3), and the middle layer 2 has an impurity concentration of about 5.0E15 (cm sub −3). In this case, the n-type pillar layer 4 can be determined to have impurity concentrations that gradually decrease from 2.5E15(cm sub −3) at the bottom to 2.0E15(cm sub −3) in the vicinity of the upper surface in proportion as approaching to the upper surface.

It should be noted that the embodiments of the invention have been described above though the present invention is not limited to these embodiments. Rather, various modifications and additions can be devised without departing from the sprit and scope of the invention.

What is claimed is:

1. A semiconductor device, comprising:
   a semiconductor substrate of a first conduction type serving as a common drain of a plurality of power MISFET cells;
   a middle semiconductor layer of said first conduction type formed on said semiconductor substrate;
   a plurality of pillar semiconductor regions of said first conduction type formed into strips on said middle semiconductor layer, and
   a plurality of pillar semiconductor regions of a second conduction type formed into strips on said middle semiconductor layer, each having both sides sandwiched between said pillar semiconductor regions of said first conduction type;
   a source diffusion layer of said first conduction type formed above said pillar semiconductor region of said second conduction type;
   a gate insulator film formed over a region sandwiched between said source diffusion layer and said pillar semiconductor region of said first conduction type;
   a gate electrode formed on said gate insulator film,
   wherein the middle semiconductor layer has a lower impurity concentration than that of said semiconductor substrate, and has a higher impurity concentration than those of said pillar semiconductor regions of said first conduction type.

2. The semiconductor device according to claim 1, wherein said middle semiconductor layer has an impurity concentration approximately ranging from 5.0E15 ($cm^{-3}$) to 6.0E16 ($cm^{-3}$).

3. The semiconductor device according to claim 1, wherein said middle semiconductor layer has an impurity concentration approximately equal to 2.5-30 times said impurity concentration in said pillar semiconductor region of said first conduction type.

4. The semiconductor device according to claim 1, wherein said pillar semiconductor region of said first conduction type or said pillar semiconductor region of said second conduction type has a concentration gradient in the vertical direction.

5. The semiconductor device according to claim 4, wherein said pillar semiconductor region of said first conduction type has a higher carrier concentration at a lower portion close to said semiconductor substrate than that of said pillar semiconductor region of said second conduction type, and said pillar semiconductor region of said second conduction type has a higher carrier concentration at an upper portion opposite to said semiconductor substrate than that of said pillar semiconductor region of said first conduction type.

6. The semiconductor device according to claim 5, wherein said pillar semiconductor region of said first conduction type has an about 5-30% higher carrier concentration at a lower portion close to said semiconductor substrate in the vertical direction, and said pillar semiconductor region of said second conduction type has a 5-30% higher carrier concentration at an upper portion opposite to said semiconductor substrate in the vertical direction.

7. The semiconductor device according to claim 1, wherein said middle semiconductor layer has a thickness of 1-30 μm.

8. A semiconductor device, comprising:
a semiconductor substrate of a first conduction type serving as a common drain to a plurality of power MISFET cells;
a plurality of pillar semiconductor regions of said first conduction type formed into strips, each having a lower impurity concentration than that of said semiconductor substrate, and
a plurality of pillar semiconductor regions of a second conduction type formed into strips, each having both sides sandwiched between said pillar semiconductor regions of said first conduction type;
a source diffusion layer of said first conduction type formed above said pillar semiconductor region of said second conduction type;
a gate insulator film formed over a region sandwiched between said source diffusion layer and said pillar semiconductor region of said first conduction type;
a gate electrode formed on said gate insulator film; and
an isolation film formed between said pillar semiconductor regions of said first conduction type to isolate said pillar semiconductor regions of said first conduction type from each other,
wherein said pillar semiconductor region of said first conduction type has a higher carrier concentration at a lower portion close to said semiconductor substrate than that of said pillar semiconductor region of said second conduction type, and said pillar semiconductor region of said second conduction type has a higher carrier concentration at an upper portion opposite to said semiconductor substrate than that of said pillar semiconductor region of said first conduction type.

9. The semiconductor device according to claim 8, wherein said pillar semiconductor region of said first conduction type has an about 5-30% higher carrier concentration at a lower portion close to said semiconductor substrate in the vertical direction, and said pillar semiconductor region of said second conduction type has a 5-30% higher carrier concentration at an upper portion opposite to said semiconductor substrate.

10. The semiconductor device according to claim 8, wherein said pillar semiconductor region of said second conduction type has impurity concentrations that vary stepwise in the vertical direction.

11. The semiconductor device according to claim 8, further comprising a terminal portion having an impurity concentration distribution different from that in said pillar semiconductor region of said first conduction type.

12. The semiconductor device according to claim 1, further comprising an isolation film formed between said pillar semiconductor regions of said first conduction type to isolate said pillar semiconductor regions of said first conduction type from each other.

13. The semiconductor device according to claim 12, wherein said isolation film reaches said middle semiconductor layer at least.

14. The semiconductor device according to claim 12, wherein said middle semiconductor layer has an impurity concentration approximately ranging from 5.0E15 (cm$^{-3}$) to 6.0E16 (cm$^{-3}$).

15. The semiconductor device according to claim 12, wherein said middle semiconductor layer has an impurity concentration approximately equal to 2.5-30 times said impurity concentration in said pillar semiconductor region of said first conduction type.

16. The semiconductor device according to claim 12, wherein said pillar semiconductor region of said first conduction type or said pillar semiconductor region of said second conduction type has a concentration gradient in the vertical direction.

17. The semiconductor device according to claim 16, wherein said pillar semiconductor region of said first conduction type has a higher carrier concentration at a lower portion close to said semiconductor substrate than that of said pillar semiconductor region of said second conduction type, and said pillar semiconductor region of said second conduction type has a higher carrier concentration at an upper portion opposite to said semiconductor substrate than that of said pillar semiconductor region of said first conduction type.

18. The semiconductor device according to claim 17, wherein said pillar semiconductor region of said first conduction type has an about 5-30% higher carrier concentration at a lower portion close to said semiconductor substrate in the vertical direction, and said pillar semiconductor region of said second conduction type has a 5-30% higher carrier concentration at an upper portion opposite to said semiconductor substrate in the vertical direction.

19. The semiconductor device according to claim 12, wherein said middle semiconductor layer has a thickness of 1-30 μm.

* * * * *